(12) United States Patent
Markham

(10) Patent No.: US 6,654,508 B1
(45) Date of Patent: Nov. 25, 2003

(54) CORRECTION AND INTERPOLATION OF POSITION ENCODERS

(75) Inventor: Roger G. Markham, Webster, NY (US)

(73) Assignee: Xerox Corporation, Stamford, CT (US)

( * ) Notice: Subject to any disclaimer, the term of this patent is extended or adjusted under 35 U.S.C. 154(b) by 590 days.

(21) Appl. No.: 09/722,183

(22) Filed: Nov. 27, 2000

(51) Int. Cl.⁷ .................................................. G06K 9/00
(52) U.S. Cl. ....................... 382/291; 382/286; 358/1.44
(58) Field of Search ................................ 382/291, 286; 347/86.5; 356/614, 600, 625; 358/1.5, 488; 700/303; 702/155

(56) References Cited

U.S. PATENT DOCUMENTS

| | | | | |
|---|---|---|---|---|
| 5,134,404 A | * | 7/1992 | Peterson | 341/116 |
| 5,870,112 A | * | 2/1999 | Kang et al. | 347/9 |
| 6,232,594 B1 | * | 5/2001 | Eccher et al. | 250/231.14 |
| 6,357,848 B1 | * | 3/2002 | Underwood et al. | 347/16 |
| 6,407,683 B1 | * | 6/2002 | Dreibelbis | 341/111 |
| 6,595,611 B1 | * | 7/2003 | Ruffino | 347/5 |
| 2002/0041314 A1 | * | 4/2002 | Santhanam et al. | 347/86 |
| 2003/0001592 A1 | * | 1/2003 | Boronkay et al. | 324/699 |

* cited by examiner

Primary Examiner—Jayanti K. Patel
Assistant Examiner—Barry Choobin
(74) Attorney, Agent, or Firm—William Epert

(57) ABSTRACT

The present invention provides a method for referencing the position of a moving component. The method includes generating a first signal in response to the relative movement between a first sensor and encoder strip having a repeating pattern of fiducial marks, the first signal including a plurality of transitions corresponding to the repeating pattern; generating a second signal in response to the relative movement of a second sensor and the encoder strip, the second signal including a plurality of transitions corresponding to the repeating pattern; estimating a position of the moving component based upon the transitions within the first sensor signal; and identifying a direction of movement of the moving component in response to the first and second signals.

8 Claims, 6 Drawing Sheets

CORRECTION AND INTERPOLATION OF POSITION ENCODERS

BACKGROUND OF THE INVENTION

The present invention relates generally to position referencing devices and more particularly relates to techniques for correcting systematic errors found in commercial position encoders and for accurately extrapolating encoders to higher resolution.

A wide range of devices across a wide range of applications require accurately tracking and referencing the position of a moving component. One method of tracking the position and motion of a controlled component is with the use of a quadrature position encoder responsive to an strip encoded with a regular periodic pattern. The use of an encoded strip and quadrature position encoder combination provides a relatively simple yet accurate tracking device for referencing the position of the moving component. However, it has been observed that such commercial quadrature position encoders typically possess and exhibit a systematic error pattern. This systematic error pattern, although within the specifications of the encoder, can generate adverse results.

Consider, for example, liquid ink printers, such as piezoelectric, thermal, acoustic or phase change wax-based, in which droplets of ink are ejected from a print head towards a recording sheet. In a carriage type printer, the print head is attached to a carriage which is reciprocated to print one swath of information on a stationary recording medium, such as paper or a transparency. As the print head is passed across the recording medium ink drops are expelled from the print head at the appropriate time (position across the medium) to generate an accurate printed image. After the swath is printed, the paper can be stepped a distance equal to the height of the printed swath or a portion thereof, so that the next printed swath is contiguous or overlapping therewith. This procedure is repeated until the entire page is printed.

Reciprocating carriage printers typically include a position encoder, such as a quadrature encoder or similar device, sensing the pattern on an encoder strip (also referred to as a fence) which includes a series of fiducial marks such as alternating black and clear bars. The use of a fence and quadrature position encoder combination operates as a tracking device for referencing the position of the print head to enable firing the print head with the correct timing. However, as mentioned above, commercial quadrature position encoders typically possess and exhibit a systematic error pattern which can generate objectionable results in the printed image.

This error pattern is illustrated in the graph of FIG. 1, wherein there is plotted a curve showing the time between transitions for a commercial quadrature encoder used to reference the position of a print head as the carriage scans the recording medium at a constant speed. The data was collected using a commercial quadrature encoder with a fence pattern that was repeated 150 times per inch, providing a resolution of 600 transitions per inch. As can be seen in FIG. 1, the encoder possess a systematic error wherein the timing for every fourth transition is significantly different from the others. Using this configuration to print at 600 spots per inch results in every fourth pixel being laterally displaced by one quarter of a pixel. This systematic drop placement error is one cause of image defects and print quality degradation.

SUMMARY OF THE INVENTION

In accordance with one aspect of the present invention, there is provided a system for referencing the position of a moving component. The system includes an encoder strip having a repeating pattern of fiducial marks; a first sensor, the first sensor and encoder strip being positioned to move relative to each other at a speed that is proportional to the speed the moving component, the first sensor generating a first signal in response to the relative movement of the first sensor and encoder strip, the first signal including a plurality of transitions corresponding to the repeating pattern; a second sensor, the second sensor and encoder strip being positioned to move relative to each other at a speed that is proportional to the speed the moving component, the second sensor generating a second signal in response to the relative movement of the second sensor and encoder strip, the second signal including a plurality of transitions corresponding to the repeating pattern; and a controller connected to receive the first signal and the second signal, the controller being responsive to the first and second signals to identify a direction of movement of the moving component, the controller being further responsive to the first signal to estimate a position of the moving component.

Pursuant to another aspect of the present invention, there is provided a method of referencing the position of a moving component. The method includes generating a first signal in response to the relative movement between a first sensor and encoder strip having a repeating pattern of fiducial marks, the first signal including a plurality of transitions corresponding to the repeating pattern; generating a second signal in response to the relative movement of a second sensor and the encoder strip, the second signal including a plurality of transitions corresponding to the repeating pattern; estimating a position of the moving component based upon the transitions within the first sensor signal; and identifying a direction of movement of the moving component in response to the first and second signals.

DETAILED DESCRIPTION OF THE INVENTION

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

Figure 2:
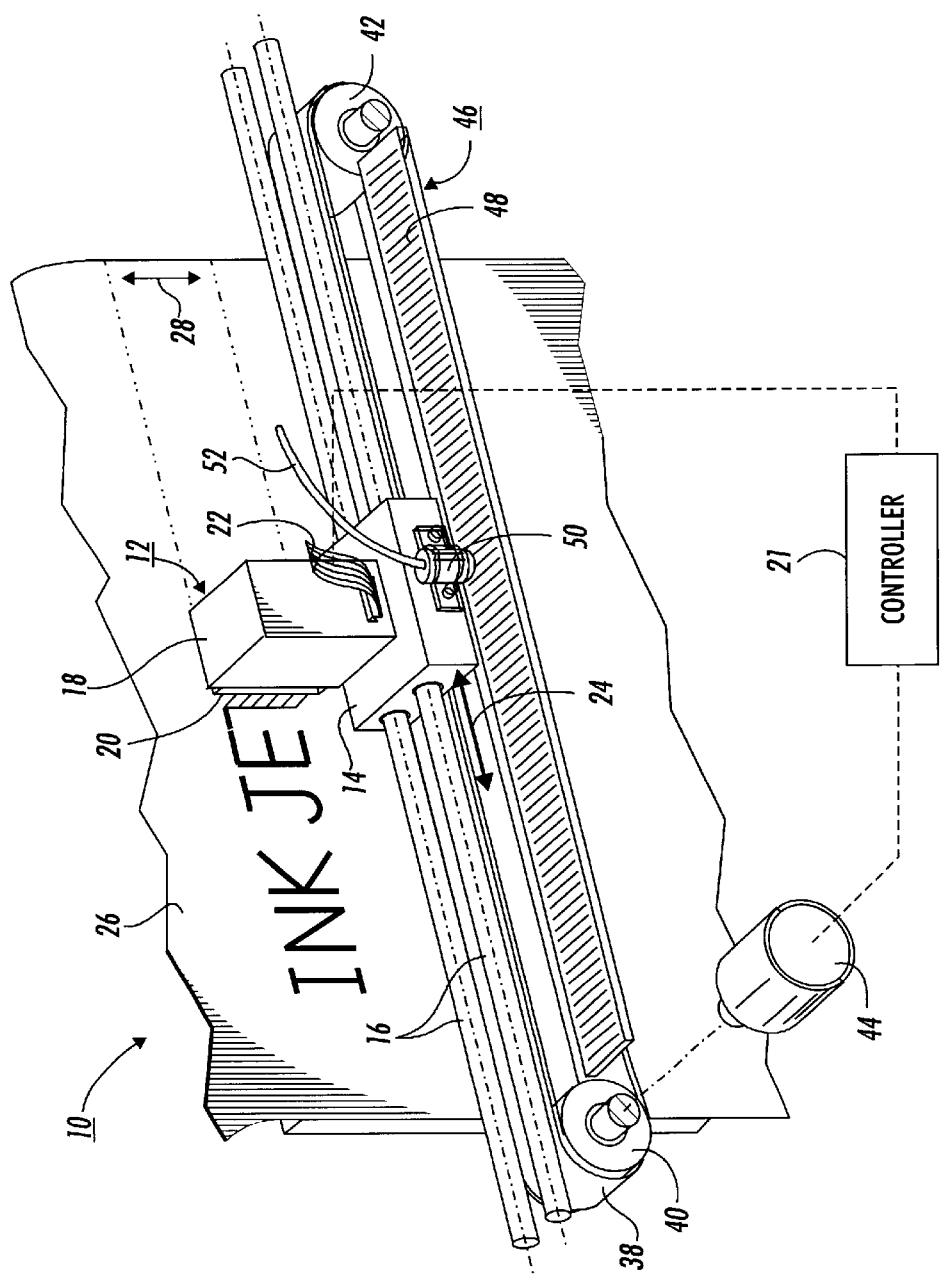
FIG. 2 is a partial schematic perspective view of an ink jet printer incorporating the present invention.

FIG. 2 illustrates a partial schematic perspective view of ink jet printer 10 having ink jet print head cartridge 12 mounted on carriage 14 supported by carriage rails 16. Cartridge 12 includes housing 18 containing ink for supply to print head 20 which selectively expels droplets of ink through orifices or nozzles (not shown) under control of electrical signals received from controller 21 through cable 22. Controller 21 is further coupled to one or more print head control circuits. The print head control circuits receive information over a bus (not shown) for controlling print head elements. The print head elements are controlled by the controller 21 according to the content of signals received to control selected ejection of inks from the nozzles of the print head element.

When printing, carriage 14 reciprocates or scans back and forth along carriage rails 16 in the directions of arrow 24. As the print head cartridge 12 reciprocates back and forth across recording medium 26, droplets of ink are expelled from selected ones of the print head nozzles towards recording medium 26. During each pass of carriage 14, recording medium 26 is held in a stationary position. At the end of each pass, however, the recording medium is stepped by a stepping mechanism under control of the printer controller 21 in the direction of arrow 28.

The carriage 14 can be moved back and forth in the scanning directions 24 by belt 38 attached thereto. Belt 38 is driven by first and a second rotatable pulleys 40 and 42. Pulley 40 is, in turn, driven by a reversible motor 44 under control of controller 21. Although shown as a belt/pulley system, it should be appreciated that a variety of devices exist to control the motion of the carriage including, for example, a cable/capstan, lead screw or other mechanisms as known by those skilled in the art.

When printing, a host computer, or other image generating device, provides image data which may include any combination of bitmapped data, grayscale or continuous tone (contone) data, graphics primitives, page description language (PDL), etc. Controller 21 transforms the digital image data into print ready data for output on suitable medium. To generate an output image, controller 21 directs the movement of cartridge 12 to scan across the recording medium. As the print head scans across the recording medium, ink drops are expelled from the print head at the appropriate time (position across the scanned recording medium) to generate an accurate printed image.

To track the movement and/or reference the position of carriage 14, the printer includes an encoder strip 46, also referred to as a fence, comprising a series of fiducial marks in a pattern 48. The pattern 48 is sensed by a position sensor 50, such as quadrature position encoder. Encoder 50 includes a cable 52 which transmits a sensor signal in response to the sensed fiducial marks of pattern 48 to controller 21. In accordance with the present invention, controller 21 operates on the sensor signal to track the movement and/or reference the position of carriage 14.

Briefly reviewing, quadrature encoders, such as are commercially available from Hewlett Packard as model HEDS-9200-P00 (other models available form Hewlett Packard include the HEDS-9XXXX series for linear encoding and HEDS-55XX series for rotatary encoding), typically comprise a single module having two sensors. Each sensor is masked or otherwise fabricated to respond to a narrow range of spatial frequencies. The sensor can be thought of as a gap sensor with a piece of the fence pattern glued to the photo-receiver. The two sensors in the module are displaced relative to each other by one quarter (¼) of the period of the fence pattern. Thus, as the encoder moves relative to the fence, each sensor will transition while the other sensor is mid-way between transitions. By tracking the transitions of each of the sensors, the encoder can be used to indicate the position of carriage at four times the periodic frequency of the pattern on the fence. By tracking the transitions sensed, it is also straightforward to track changes in direction and determine the motion of direction.

Figure 3:
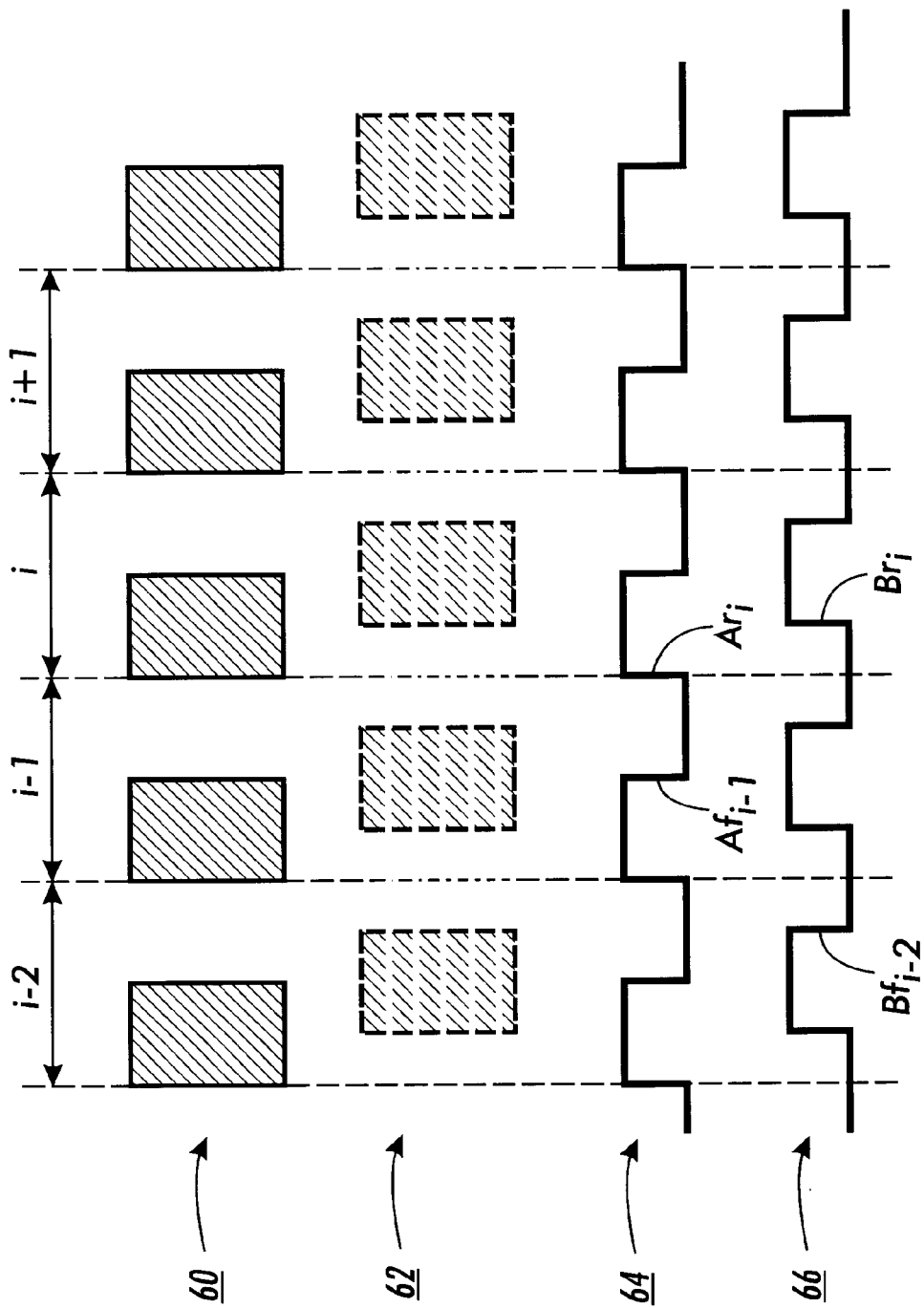
FIG. 3 illustrates the operation of a quadrature encoder.

Referring now to FIG. 3, there is shown a graphic representation of the operation of a quadrature sensor module. In FIG. 3, there is shown a representative encoder strip (fence) pattern 60 comprising a series of regularly spaced black bars to be sensed by the first sensor, referred to as sensor A. Pattern 62 is a replica of pattern 60 displaced by one quarter (¼) of the fence pattern period to illustrate the pattern sensed by the second sensor, referred to as sensor B. Plots 64 and 66 illustrate a representative output for sensors A and B, respectively, as the sensors move over the pattern. Specifically, each time the sensor moves onto or off of a black bar it toggles the output signal. These toggles or transitions in output signals take the form of either a rising edge or falling edge transition. As used herein, a rising edge transition of sensor A in a given fence period i is identified as $Ar_i$ and a falling edge is identified as $Af_i$. Similarly, the rising and falling transitions of sensor B in a given period i are identified as $Br_i$ and $Bf_i$, respectively. Each of the four edge transitions within a period corresponds to a reference position identifying the location of the moving carriage. Thus, each transition can be used to trigger a desired action such as generating an output pulse, toggling a switch, activating a latch, etc.

Figure 1:
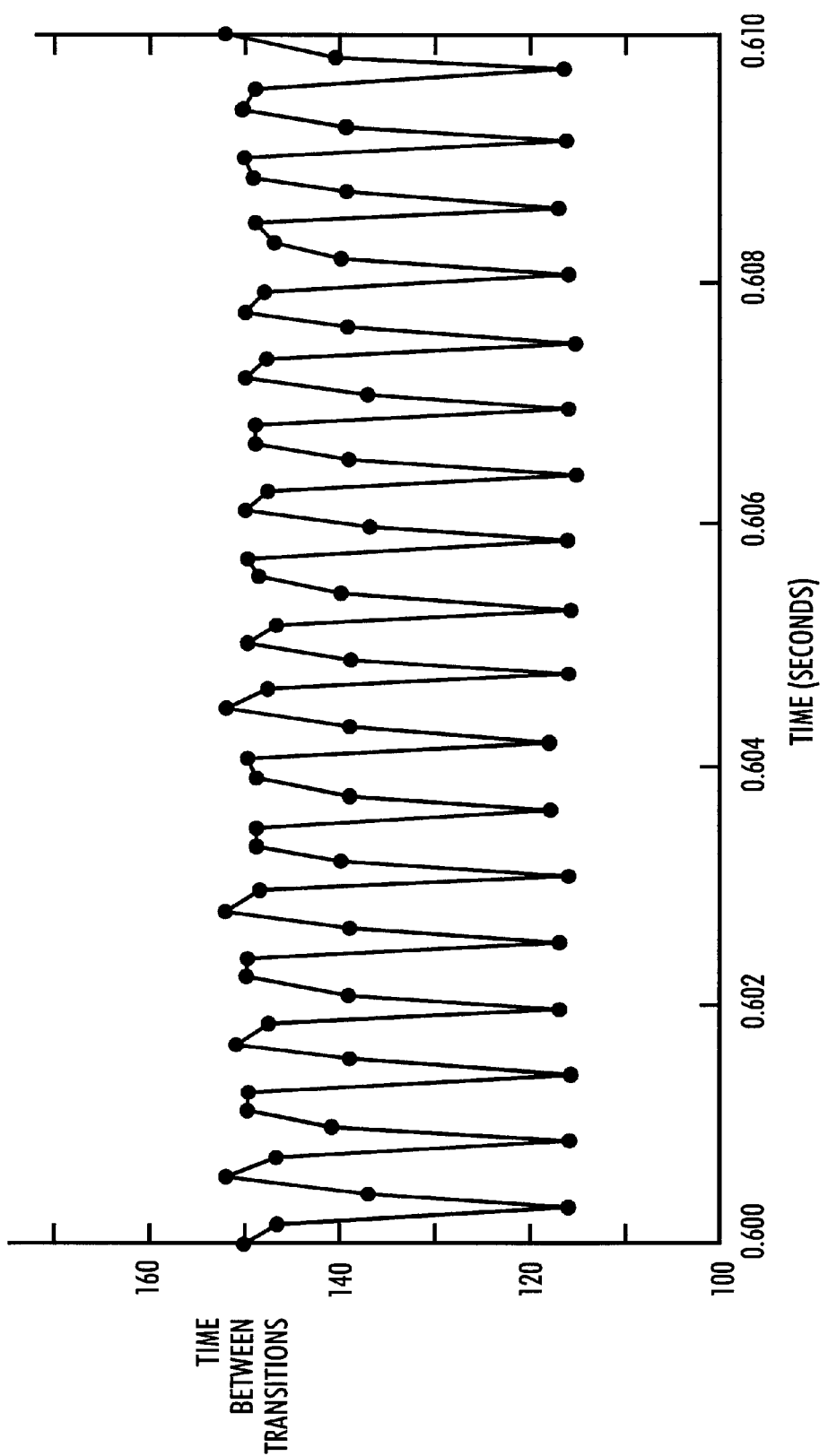
FIG. 1 is a graph illustrating the periodic error exhibited in the output of a conventional quadrature position encoder.

Under error free conditions, the time between successive transitions, i.e., each rising and falling edge, would be equal. However, as discussed above, commercial quadrature position encoders typically exhibit a systematic error pattern such as is shown in the graph of FIG. 1. To reduce the systematic error observed in commercial quadrature encoders, the present invention proposes to average out the error and interpolate back to the desired printing resolution. Increasing the number of "transitions" through interpolation increases the number of events referencing the position of the carriage at a given point in time.

It should be appreciated that the sensor signals can take other forms and are not limited to the format shown in FIG. 3. The description of the present invention is equally applicable to these other formats by designating the signal event triggered by the passing onto a black bar as a rising edge transition and the signal event triggered by passing off of a black bar as a falling edge transition.

Since the error pattern is regular and the carriage moves at a constant velocity during the period it scans across the recording medium, one solution is to discard the data from all but the rising (or falling) transitions form a single sensor. As can be seen from FIG. 1, with a constant velocity the duration of a fence period (time elapsed in traversing one fence period) as measured using a single transition type for a single sensor should be regular. With a regular duration, one could measure the interval between the rising (or falling) edges of a given sensor and insert the missing "transitions" on a regular basis based on the previously measured interval. Although any previously measured interval can be used to obtain the duration of a period for generating the missing pulses, the possibility of variations in carriage speed make it desirable to use a duration measured from a recent period. That is, for a given fence period i of FIG. 3, $Ar_i$ is obtained directly from sensor A with edge transitions $Br_i$, $Af_i$ and $Bf_i$ being estimated as occurring at equal intervals across the period with the duration of the period being estimated as (based on) a prior measured fence period, such as the measured interval between $Ar_{i-2}$ and $Ar_{i-1}$ or between $Ar_{i-1}$ and $Ar_i$.

Figure 4:
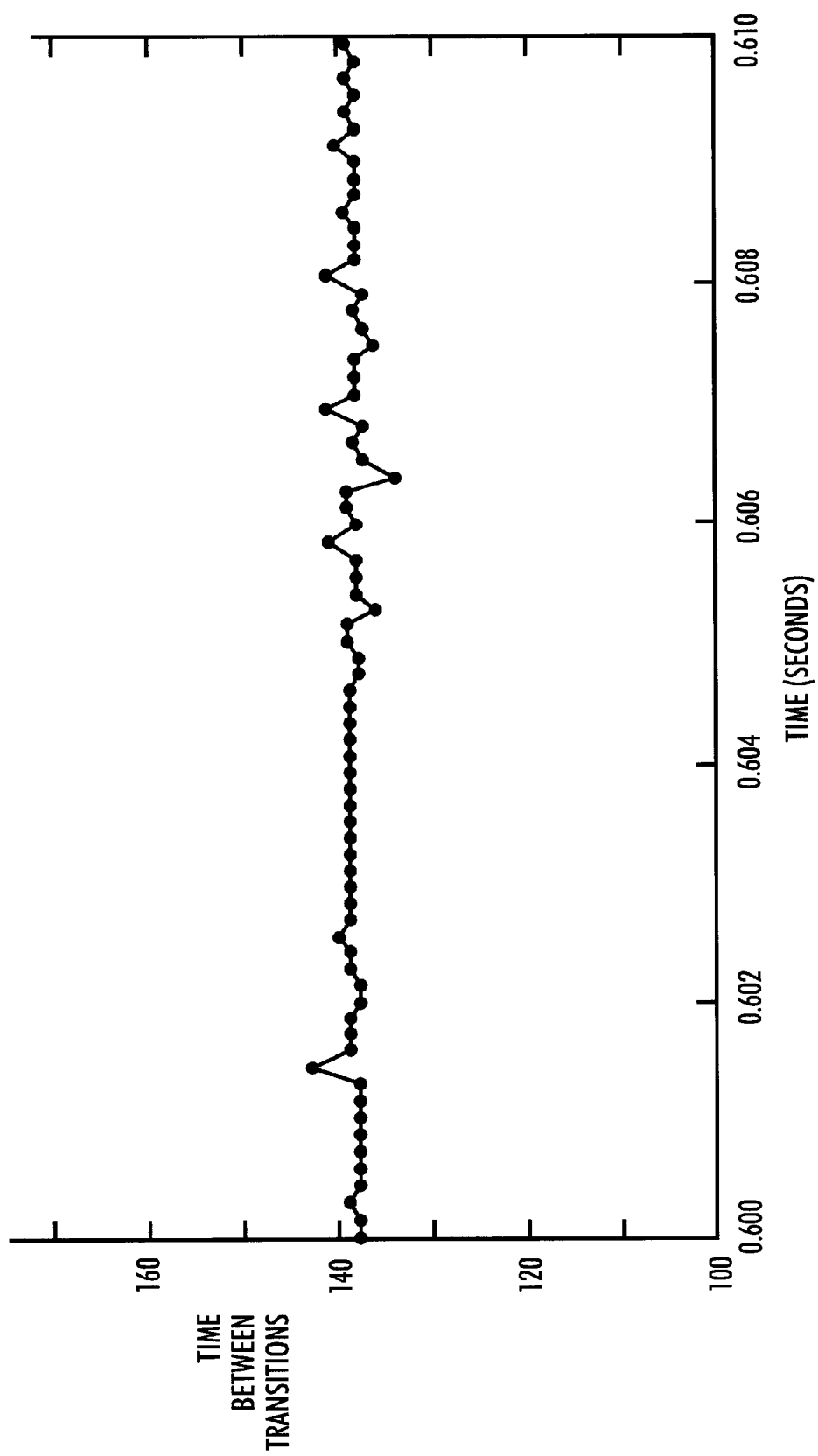
FIG. 4 illustrates the reduced error in the output of a quadrature position encoder obtained using a process in accordance with the present invention.

FIG. 4 shows a plot generated by filtering the data of the curve of FIG. 1 to retain only one of the edge transitions generated for each fence period and replace the others with simulated transitions inserted at equal intervals based on the previous measured fence period. The procedure is not limited to estimating (inserting) the same number of transitions that have been skipped. That is, the method can operate to set any resolution by inserting the appropriate number of transitions at equal intervals based upon a previous measurement of the time between the rising (or falling) edge transitions of the given sensor. For example, to generate seven estimated transitions based upon the measurement of a previous fence period, one would simply divide by the number of edge transitions over the period (four in the given example) and multiple by the number of desired transitions over the period (eight in the given example).

As can be seen from FIG. 4, a process based on determining the average duration of a fence period using a single sensor/single edge transition combination greatly reduces the error. However, at lower carriage speeds variations in carriage speed can diminish the value of the method. Specifically, any errors from changes in carriage speed accumulate over the current period with the accumulated error being made up between the last estimated transition of the current period and the measured edge transition beginning the next period. To reduce the error at lower carriage speeds, the present invention contemplates updating the measured time more frequently by using more than a single transition to update the measured period more during the current period.

The present invention contemplates the use of either two, three or four edge transitions to update the period more frequently. The use of four transitions to update the estimate for the period can be described with reference to FIG. 3. Using period i as the current period, the rising edge of sensor A, $Ar_i$, marks the beginning of the period, The duration of the period is determined as the average of the measured time differences between four previous transition pairs, e.g., $Ar_{i-1}$ and $Ar_i$, $Bf_{i-2}$ and $Bf_{i-1}$, $Af_{i-2}$ and $Af_{i-1}$, $Br_{i-2}$ and $Br_{i-1}$. That is, each transition pair provide a measured duration of previous period. These four previous durations are averaged to determine the estimated duration of the current period.

Upon detection of the transition $Br_i$, the estimated period is updated by dropping the difference between $Br_{i-2}$ and $Br_{i-1}$ from the rolling average and including the difference between $Br_{i-1}$ and $Br_i$. It should be understood that the detection of an edge transition is used only to update the estimated duration of the current period and is not used to provide a transition. Furthermore, it should be appreciated that the estimated period can be based on the time difference between two, three or four sets of edge transitions and that the estimated period need not be based on the transitions directly prior to the current period.

Figure 5:
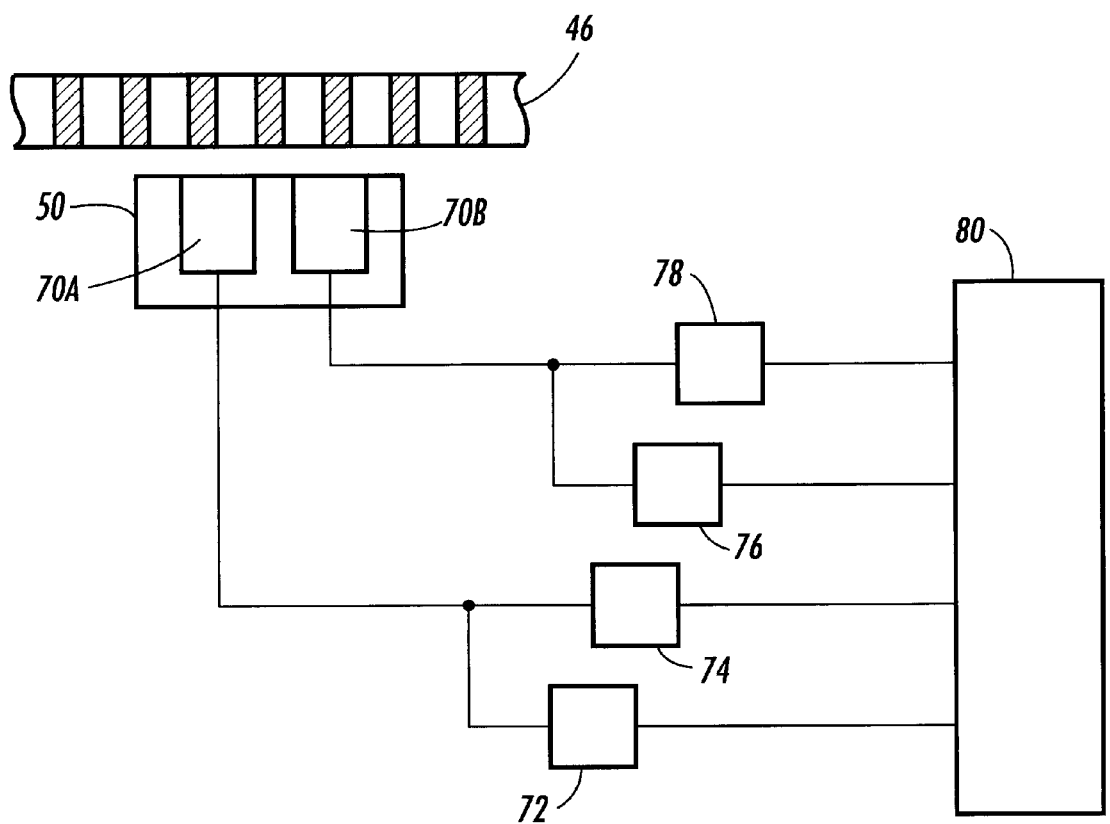
FIG. 5 illustrates a system for estimating the position of a moving carriage in accordance with the present invention.

Turning to FIG. 5, there is shown a system improving the resolution of a position encoder by averaging out the error and interpolating back to a desired position referencing resolution in accordance with the present invention. In FIG. 5, position sensor 50 is shown comprising sensors 70A and 70B responsive to pattern 48 of encoder strip 46. The output signal of each sensor is connected to a pair of timing modules. Each timing module determines a period duration by measuring the interval between successive rising edge (or falling edge) transitions at a single sensor. The output signals from timing modules are passed to interpolation module 80 which inserts estimated pulses based on the measured duration from the timing modules.

The output signal from sensor 70A is connected to timing modules 72 and 74. Timing module 72 measures the interval between each pair of successive rising edges in the output signal of sensor 70A. Module 72 measures the interval between pairs of successive falling edges in the output signal of sensor 70A. Similarly, the output signal from sensor 70B is connected to timing modules 76 and 78 which measure the interval between pairs of successive rising edge transitions and falling edge transitions in the output signal of sensor 70B. In this manner, each timing module measures the duration of one of four overlapping periods. For example, referring to FIG. 3, module 72 measures the interval between $Ar_{i-2}$ and $Ar_{i-1}$, $Ar_{i-1}$ and $Ar_i$, $Ar_i$ and $Ar_{i+1}$, etc., while module 74 measures the interval between $Af_{i-2}$ and $Af_{i-1}$, $Af_{i-1}$ and $Af_i$, $Af_i$ and $Af_{i+1}$, etc.

The present invention further provides for enhancing the resolution of an encoder without requiring a reduction in the absolute error. In this procedure controller 21 measures the time interval between successive transitions for each pair of successive transitions and uses these measured time intervals to insert additional estimated transitions between measured edge transitions. To implement this procedure, controller 21 includes a single timing module connected to receive the output signals from sensors A and B. The timing module measures the interval between successive edge transitions received.

Figure 6:
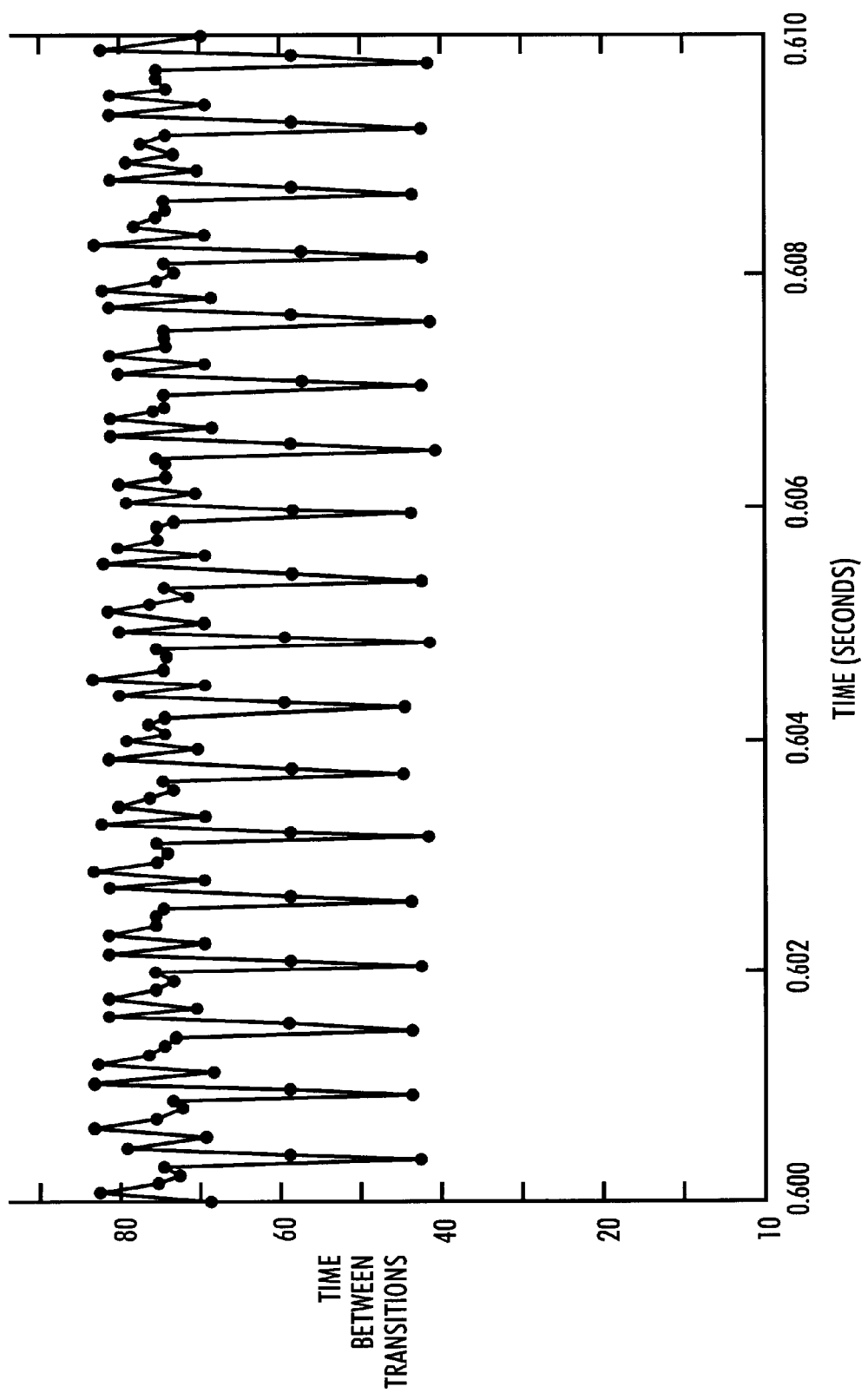
FIG. 6 illustrates an enhanced resolution position reference generated from the output of a quadrature position encoder obtained using a process in accordance with the present invention.

For example, referring to FIG. 3, to double the resolution beginning with period i, edge transition $Ar_i$ provides the first transition for the period. The procedure then inserts a estimated transition midway between $Ar_i$ and $Br_i$ by estimating the time between edge transitions $Ar_i$ and $Br_i$ to be equal to that of a prior period such as the interval between $Ar_{i-1}$ and $Br_{i-1}$. Upon receipt of edge transition $Br_i$, the controller inserts an estimated transition based upon the time interval between $Br_{i-1}$ and $Af_{i-1}$. The process continues for each transition pair. Thus, every other transition is due to the encoder with estimated transitions being inserted midway therebetween based on prior measured intervals. FIG. 6 shows the results of applying the above-described method to the data of FIG. 1. As would be expected, the error pattern is the same as that of FIG. 1 with extra transitions carefully inserted between the transitions form the encoder. It should be noted that, although described as estimating the time between successive edge transitions as being based on the time measured in the prior period, the estimated time may be measured in any previous period.

It is well known and commonplace to program and execute imaging, printing, document, and/or paper handling control functions and logic with software instructions for conventional or general purpose microprocessors, such as controller 21. Additionally, it should be apparent to those skilled in the art that the disclosed system or method may be implemented in software, hardware, or a combination thereof.

It should be appreciated that the above description, although referencing a linear encoders, is equally applicable to a rotational encoder. That is, the linear encoder strip can be though of as a finite section of a larger rotational encoder strip. Additionally, the encoder is not limited to the two sensors as described above. Those skilled in the art it will readily recognize that the sensor module can have greater number of individual sensors, each of which is displaced relative to the others by the appropriate fraction of the period of the encoder pattern.

It is, therefore, apparent that there has been provided in accordance with the present invention, a method and apparatus to reduce error in quadrature encoders. While this invention has been described in conjunction with a specific embodiment thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A system for referencing the position of a moving component, comprising:

an encoder strip having a repeating pattern of fiducial marks having a period P;

a first sensor, the first sensor and encoder strip being positioned to move relative to each other at a speed that is proportional to the speed the moving component, the first sensor generating a first signal in response to the relative movement of the first sensor and encoder strip, the first signal including a plurality of transitions corresponding to the repeating pattern;

a second sensor, the second sensor and encoder strip being positioned to move relative to each other at a speed that is proportional to the speed the moving component, the second sensor generating a second signal in response to the relative movement of the second sensor and encoder strip, the second signal including a plurality of transitions corresponding to the repeating pattern; and a controller connected to receive the first signal and the second signal, the controller being responsive to the first and second signals to identify a direction of movement of the moving component, the controller being responsive to the first signal to estimate a position of the moving component.

2. The system of claim 1, further comprising a timing module connected to receive the first signal, the timing module measuring a period duration as the an interval between one of successive rising edges and successive falling edges; wherein the controller estimates the position of the moving component based on the measured duration.

3. The system of claim 1, further comprising:

a first timing module connected to receive the first signal, the timing module measuring a first duration as the interval between one of successive rising edges and successive falling edges; and a second timing module connected to receive the second signal, the second timing module measuring a second duration as the an interval between one of successive rising edges and successive falling edges in the second signal;

wherein the controller estimates the position of the moving component during a fence period based on the average of the first and second measured durations.

4. A method for referencing the position of a moving component, comprising:

generating a first signal in response to the relative movement between a first sensor and encoder strip having a repeating pattern of fiducial marks, the first signal including a plurality of transitions corresponding to the repeating pattern;

generating a second signal in response to the relative movement of a second sensor and the encoder strip, the second signal including a plurality of transitions corresponding to the repeating pattern;

estimating a position of the moving component based upon the transitions within the first sensor signal; and identifying a direction of movement of the moving component in response to the first and second signals.

5. The method of claim 4, wherein the step of estimating a position of the moving component comprises:

measuring a period duration as an interval between a selected one of successive rising edges and successive falling edges;

identifying a selected one of a rising edge transition and a falling edge transition in the first signal as a reference position for a current period of the moving component; and generating an estimated position of the moving component subsequent to the reference position as a function of the measured duration.

6. The method of claim 5, wherein the step of generating an estimated position estimates a position of the moving component at regular intervals throughout the current period based on the measured duration.

7. The method of claim 4, wherein the step of estimating a position of the moving component comprises:

measuring a first duration as the interval between a selected one of successive rising edges and successive falling edges in the first signal;

measuring a second duration as the interval between a selected one of successive rising edges and successive falling edges in the second signal;

identifying a selected one of a rising edge transition and a falling edge transition in the first signal as a reference position for a current period of the moving component;

determining an average of the first duration and the second duration; and generating an estimated position of the moving component subsequent to the reference position as a function of the average duration.

8. The method of claim 7, wherein the step of generating an estimated position estimates a position of the moving component at regular intervals throughout the current period based on the measured duration.

* * * * *